United States Patent

Mawhinney et al.

[11] 4,162,412
[45] Jul. 24, 1979

[54] MICROWAVE POWER LIMITER COMPRISING A SINGLE-GATE FET

[75] Inventors: Daniel D. Mawhinney; Herbert J. Wolkstein, both of Livingston; Arye Rosen, Cherry Hill, all of N.J.; Zygmond Turski, Selden, N.Y.

[73] Assignee: RCA Corporation, New York, N.Y.

[21] Appl. No.: 838,656

[22] Filed: Oct. 3, 1977

[51] Int. Cl.² .................... H03G 11/04; H04B 3/04
[52] U.S. Cl. .................. 307/237; 307/264; 328/171; 328/172; 333/17 L
[58] Field of Search .............. 307/264, 237; 333/17 L; 328/169–172

[56] References Cited

U.S. PATENT DOCUMENTS 4,079,325  3/1978  Mawhinney et al. ............ 307/261 X

OTHER PUBLICATIONS

Fukuda et al., "A New Microwave Amplitude Limiter Using GaAs Field Effect Transistor"; IEEE Microwave Theory and Techniques Conf.; Jun. 1977.
Int'l Microwave Symposium; 6/1977, in *Microwaves* (pub.), pp. 9–10.

*Primary Examiner*—Larry N. Anagnos
*Attorney, Agent, or Firm*—H. Christoffersen; Joseph D. Lazar; Robert M. Rodrick

[57] ABSTRACT

A microwave power limiter for generating an output RF signal of substantially constant power level in response to an input RF signal of varying power level comprises a single gate field effect transistor (FET). The FET is biased such that the RF power output variation is small compared to the input power variation in the saturation region. A number of FET cascaded stages may be utilized to reduce this power output variation. A small signal amplifier including a number of FET cascaded stages may be employed in the limiter to increase the power level to that gain or drive level compatible with the saturated FET stages.

3 Claims, 9 Drawing Figures

MICROWAVE POWER LIMITER COMPRISING A SINGLE-GATE FET

The Government has rights in this invention pursuant to Contract No. N00039-74-C-0227 awarded by the Department of the Navy.

CROSS REFERENCE TO RELATED APPLICATIONS

Of interest is the following copending application Ser. No. 838,720, filed on Oct. 3, 1977, entitled "Microwave Power Limiter Comprising a Dual-Gate FET", based on the invention of Herbert J. Wolkstein, Arye Rosen and Jitendra Goel and assigned to the same assignee as is the present invention.

BACKGROUND OF THE INVENTION

1. Field of the Invention

This invention relates to a microwave power limiter and, more particularly, to a power limiter including a single gate field effect transistor.

2. Description of the Prior Art

Many commercial and military systems require a source of constant RF power while simultaneously tolerating a wide variation of RF input power to the same system. It is often a system requirement that this fixed output power level be obtained over a wide frequency bandwidth. Such a power limiter having these desirable characteristics may be used as an RF amplifier, front end receiver where fixed output power is necessary for radar terrain mapping and associated video oscilloscope displays. Other limiter applications include receivers that are used for phase and frequency identification for electronic countermeasure (ECM) systems. In this application, fixed input power is generally applied to phase discriminators for accurate conversion of frequency (or phase) into an output dc voltage. A limiter having these properties may also be utilized for bi-phase and digital communications systems where coded binary signals are received and cannot be reconstructed to constant power output levels independent of the amplitude variations of the receiving antenna.

One of the conventional approaches for achieving constant (or standardized) output power, independent of drive variation and frequency, is to utilize a multistage high gain amplifier chain. This amplifier chain is designed to constrain operation of several of the output stages to the overdriven or saturation region where the output power swing is greatly compressed in spite of large variations in the input power range to the chain. Both bipolar silicon transistors and tunnel diode amplifiers (TDA) are used in such multistage limiters. The bipolar transistor limiter is restricted, however, to low frequency applications and is not often selected for use. For other limiting amplifier circuits see U.S. Pat. No. 3,940,704 issued Feb. 24, 1976 and U.S. Pat. No. 3,999,084 issued Dec. 21, 1976 both of which use operational amplifiers and U.S. Pat. No. 3,932,768 issued Jan. 13, 1976 and U.S. Pat. No. 4,008,440 issued Feb. 15, 1977 both of which utilize differential amplifiers.

The TDA is in wide use and has heretofore provided desirable amplifier-limiter capabilities. The TDA limiter suffers, however, from diverse problems and disadvantages, limiting the applications and performance of the TDA limiter. For instance, the power output for a broadband TDA is limited to levels of about −6 dbm (0.25 mW) or less. This power output level produces an RMS output voltage of less than 0.1 volt, with a video detector circuit having an impedance of 100 ohms. Such an output is too low to drive a conventional phase interferometer-discriminator and detector without the use of video amplifiers. Another disadvantage of the TDA is that, since it is a two terminal device used as a reflection amplifier, circulators for each stage and isolators between every other stage are needed for stability of the limiter. Such a multiplicity of interconnected components typically utilizing ferrite materials produces many reflections which add in-and-out-of-phase resulting in considerable fine and coarse grain structure which directly reduces the accuracy when used with a discriminator. In such a discriminator system, for example, a variation of about 0.1 db will cause an attendant error of approximately 80 MHz in a 4 GHz band system. Furthermore, the use of necessary circulators and isolators in a multistage TDA configuration requires extensive circuitry and thereby, a relatively costly device.

SUMMARY OF THE INVENTION

According to the present invention, a power limiter generates an output RF signal of substantially constant power level in response to an input RF signal of varying power level. The limiter comprises a field effect type transistor having gate, drain and source electrodes. Included in the limiter is means for biasing the transistor such that the transistor operates in a gain region characterized by a power curve having a slope whose change in output power is substantially equal to or greater than the change in input power. The transistor also operates in a saturation region characterized by a power curve having a compression slope whose change in output power is substantially less than the change in input power such that the final output power variation is small compared to the input power variation. The substantially constant RF signal is generated over the saturation region.

DETAILED DESCRIPTION OF THE PREFERRED EMBODIMENT

Figure 1:
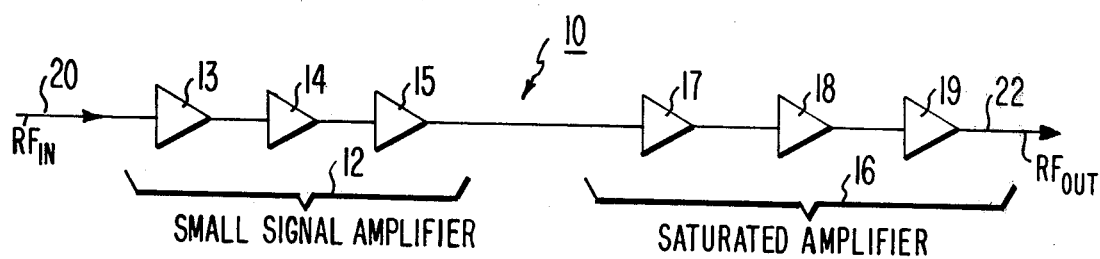
FIG. 1 is a diagrammatic representation of one embodiment of the invention showing a number of amplifier stages in cascaded arrangement.

Referring to the drawing, there is shown in FIG. 1, a microwave power limiter 10, comprising a multistage small signal amplifier 12 and a multistage saturated amplifier 16. Amplifiers 12 and 16 each comprise three stages, viz., 13, 14 and 15 and 17, 18 and 19, respectively, for purposes of illustration although any number of stages depending upon the desired operational characteristics of limiter 10 may be utilized. Stages 13, 14 and 15 of amplifier 12 and stages 17, 18 and 19 of amplifier 16 are connected in cascaded arrangement and each stage includes a single-gate, field effect transistor (FET) as will be explained in detail. An input RF signal 20 of varying power level is received by amplifier 12. An output RF signal 22 of constant power level is generated by limiter 10 in accordance with the invention as the output of amplifier 16. The stages of amplifiers 12 and 16 are biased by suitable bias arrangements (not shown in FIG. 1), the biasing of the stages to be described more fully with respect to FIGS. 4a–4c.

Figure 2:
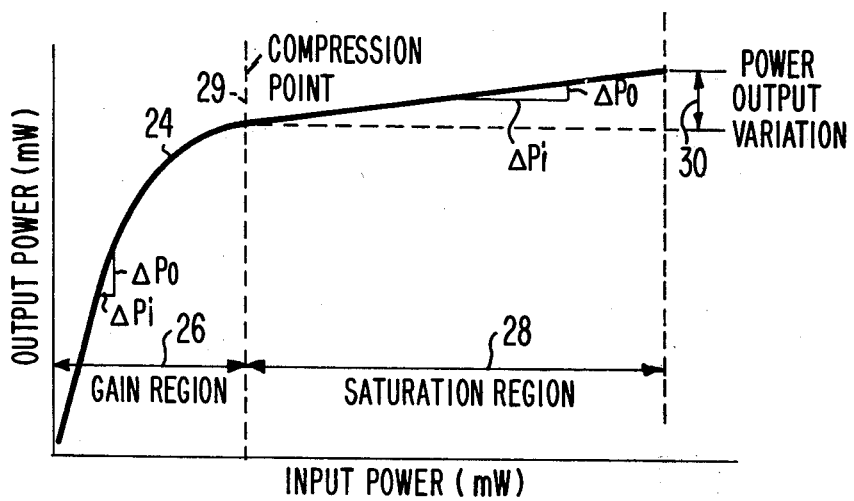
FIG. 2 is a graph showing the output power versus the input power of the power limiter of the present invention.

As shown in FIG. 2, the FETs of the stages of amplifiers 12 and 16 are biased to have their output power vary as a function of input power in accordance with curve 24. FET characteristic power curve 24 has a gain region 26 and a saturation region 28. In gain region 26 the slope of curve 24 is such that the change in output power ($\Delta$Po) is equal to or greater than the change in input power ($\Delta$Pi). In the saturation region 28 the slope of curve 24 is such that the change in output power ($\Delta$Po) is substantially less than the change in input power ($\Delta$Pi). Over the saturation range 28, the output power of the FET is constant within a power output variation 30. As with conventional amplifiers operating in the saturated condition for limiter applications, the slope of curve 24 in the saturated region 28 is commonly referred to as the "compressive slope" or the power compression ratio of the limiter. As known in the limiter art, the compressive slope is expressed as the input power drive variation versus the output power change, or $\Delta$Pi/$\Delta$Po.

For power limiter applications, it is desirable to reduce the power output variation 30 to a minimum. The change in output power for an ideal power limiter is zero for changes in input power. Practical factors, such as bias voltages, FET configuration, FET circuitry and the FET material properties, typically limit the achievement of an ideal limiter, generally resulting in a certain amount of power output variation (30) in an individual limiter stage. Cascading of a number of FET stages and operating the FET stages in a saturated or overdriven condition will reduce the final output variation 30 to a level less than that variation for a single stage. By referring to FIG. 3, such a cascaded arrangement may be more fully understood.

Figure 3A:
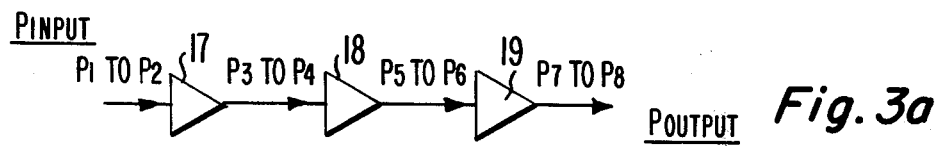
FIG. 3(a) is a block diagram illustrating the cascaded arrangement and the power distribution between the stages of the saturated amplifier of the preferred embodiment of the present invention.
Figure 3B:
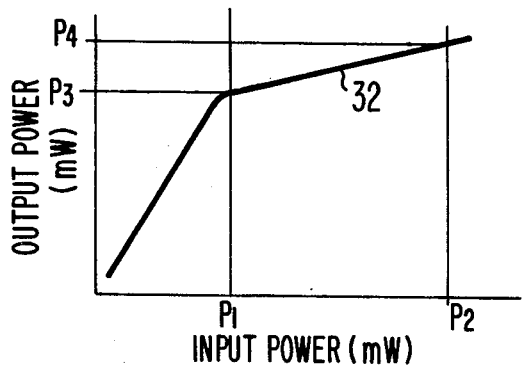
FIGS. 3(b) to 3(d) are curves graphically showing the power variation of the cascaded stages of FIG. 3(a).
Figure 3C:
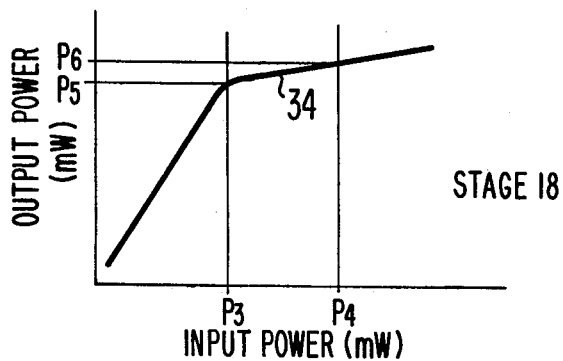
Figure 3D:
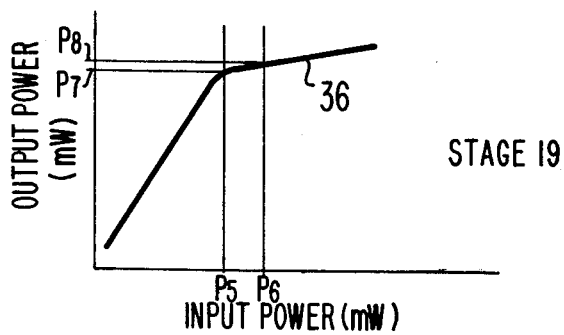

In the cascaded arrangement of FIG. 3(a), stages 17, 18 and 19 of saturated amplifier 16 are connected such that output power range ($P_3$ to $P_4$) of stage 17 is the input power range to stage 18, and the output power range ($P_5$ to $P_6$) of stage 18 is the input power range to stage 19. Power range $P_3$ to $P_4$ and range $P_5$ to $P_6$ are the output power variations of stages 17 and 18, respectively. $P_1$ to $P_2$ is the input power range to stage 17 as received from the output of small signal amplifier 12. $P_7$ to $P_8$ is the final power output variation as the output signal of stage 19. Curves 32, 34 and 36 represent the characteristic curves of the FETs of stages 17, 18 and 19 respectively as shown in FIGS. 3(b), 3(c) and 3(d). By applying the output of a preceding stage as the input of a succeeding stage as the FETs are operated in a saturated condition in which the change in output power is less than the change in input power, the final power output variation, e.g., $P_7$ to $P_8$, can be reduced, as shown graphically in FIGS. 3(b) through 3(d). In such a cascaded arrangement the final power output variation can be reduced even further by adding more stages. It should be appreciated, however, that depending upon the power output variation tolerable in a particular limiter operation, cascaded FET stages may not be needed, the output of a single stage being satisfactory.

In the preferred embodiment shown in FIG. 1, small signal amplifier 12 is utilized to produce a power level which is compatible with the desired power level of saturated amplifier 16. The FETs of each of the stages 13, 14 and 15 are biased to operate in the gain region 26 as shown in FIG. 2 such that the change in output power is equal to or greater than the change in input power. By cascading stages operating in the gain region such that the output of a preceding stage provides the input of a succeeding stage the gain level of the final output stage 15 can be increased over the gain level to the input stage 13. It should be understood that the gain level provided by small signal amplifier 12 to saturated amplifier 16 can be changed by increasing or decreasing the number of stages. It should also be appreciated that small signal amplifier 12 may be eliminated in a system where the gain level of the RF input signal 20 is compatible with the gain level of the saturated amplifier 16.

Figure 4A:
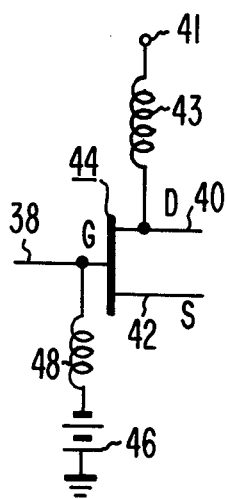
FIGS. 4(a) to 4(c) are schematic representations of biasing arrangements utilized to bias the FETs of the amplifier stages in the limiter of FIG. 1.

Each of the FETs in the stages of amplifiers 12 and 16 have gate 38, drain 40 and source 42 electrodes as shown schematically on FET 44 in FIG. 4(a). In the preferred embodiment, FET 44 is a Gallium Arsenide (GaAs) metal semiconductor field effect transistor (MESFET), although other field effect type transistors such as, for example, junction field effect transistors (JFET), wherein the current is controlled by an electric field, may also be used. FET 44 may be biased by applying a dc voltage to gate electrode 38 as by battery 46 through an inductor 48. The other terminal of battery 46 may be grounded. Biasing of FET 44 may also be achieved by pulsed voltages as well as by dc voltages. Drain electrode 40 is biased by applying a suitable voltage to terminal 41 through an inductor 43, for example.

Figure 4B:
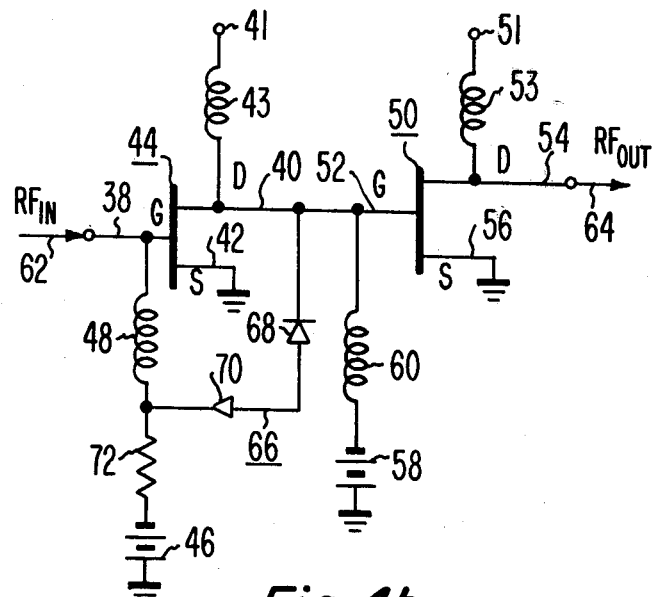

A biasing arrangement for cascaded FETs is shown in FIG. 4(b). For example, FET 44 with the biasing circuit as shown in FIG. 4(a), may be cascaded with an FET 50 of a succeeding stage. FET 50 has gate 52, drain 54 and source 56 electrodes. Drain electrode 40 of FET 44 is connected to gate electrode 52 of FET 50 and the source electrodes 42 and 56 respectively of each FET 44 and 50 are grounded. A battery 58 provides a predetermined dc voltage to gate electrode 52 through an inductor 60, the other terminal of battery 58 being grounded. The drain electrode 54 is biased by applying a suitable voltage to terminal 51 through inductor 53, for example. An input RF signal 62 may be applied at gate electrode 38 and an output RF signal 64 generated at drain electrode 54. In the preferred embodiment of the invention, a feedback network 66 is connected between the drain electrode 40 and gate electrode 38 of each of the FETs utilized. Feedback circuit 66 feeds a portion of the output signal from drain electrode 40 back as an input signal to gate electrode 38. Network 66 comprises a detector diode 68 and a video amplifier 70. A resistor 72 is connected between network 66 and battery 46 to isolate the feedback signal from the dc voltage. In the operation of FETs in the saturated condition, in particular, feedback network 66 augments the biasing of FET 44, to reduce the power output variation 30 (FIG. 2). Such a feedback network may result in a lesser number of limiter stages required to achieve a desired power output variation 30 than in a cascaded amplifier without a feedback network.

Figure 4C:
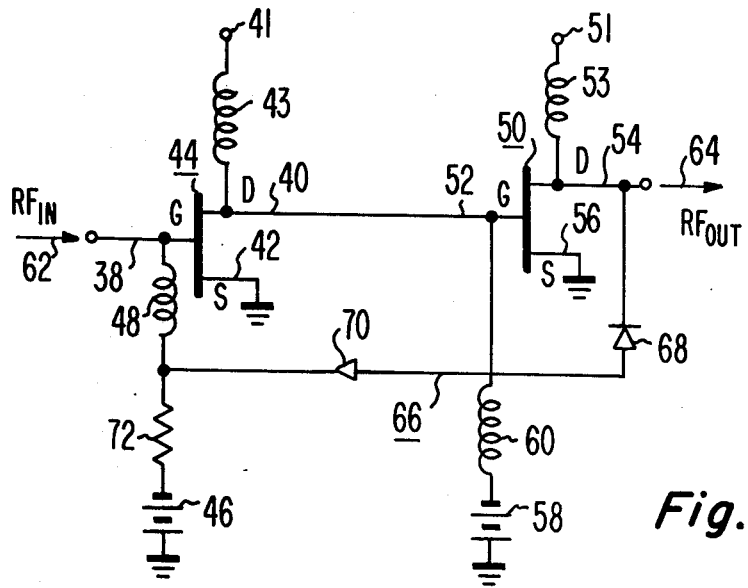

In FIG. 4(c) there is shown a modified arrangement of the biasing configuration of 4(b). In this arrangement of FIG. 4(c), the feedback network 66 is connected between gate electrode 38 and drain electrode 54 of successively cascaded FETs 44 and 50. The output power can be further limited as a function of RF input drive by using such a form of the feedback network 66 as shown in FIG. 4(c). Here the RF output power of the succeeding (or later) FET 50 is detected and amplified to provide inverse feedback to gate 38 of the preceding FET 44. Thus, an increase in power with drive causes the gain of FET 44 to be reduced. This in turn reduces or nullifies the increase in RF power, enhancing the limiting function.

The single-gate FET power limiter has been tested, the limiter comprising a small signal amplifier 12 of 5 stages and a saturation amplifier of 7 stages. The limiter was arranged to operate in X-band, and more particularly, at 10 GHz. The limiter was driven over an input power varying from 0 to +80 mw and the small signal amplifier was biased at a drain voltage of 8 V and a zero gate voltage to have a small signal gain of approximately 3.68 db. Under these operating conditions, the limiter exhibited a gain of unity at point 29, as shown in FIG. 2, where the input drive level and thereby the output power was about 60 mw. At this drive level and beyond, the compressive slope of the limiter (given by $\Delta Pi/\Delta Po$) was 5.7 db. Such a limiter can achieve a power output variation within 0.025% of the input power variation to obtain frequency accuracy of 1 MHz in a 4 GHz bandwidth for use in frequency discriminator applications. This is equivalent to an incremental power output fluctuation of 1 part in 4000, i.e., 36 db down from saturation over the total variation in the input drive range. Assuming an input drive range of 31 db, the combined value of input power swing and output limiting is equivalent to an overall compression ratio of 67 db. Such an FET limiter requires no circulators or isolators since the amplifier stages use three-terminal devices as straight through amplifiers resulting in considerably improved fine grain structure and simplification of circuitry.

What is claimed is:

1. A power limiter for generating an output RF signal of substantially constant power level in response to an input RF signal of varying power level, comprising:
   a field effect type transistor having gate, drain and source electrodes;
   means for biasing said transistor such that said transistor operates in a gain region characterized by a power curve having a slope whose change in output power is substantially equal to or greater than the change in input power, and a saturation region characterized by a power curve having a compression slope whose change in output power is substantially less than the change in input power, such that the final output power variation is small compared to the input power variations; and
   feedback circuit means connected between said drain and gate electrodes to provide a predetermined voltage to said gate electrode to reduce said final output variation;
   said substantially constant output RF signal being generated over said saturation region.

2. A power limiter for generating an output RF signal of substantially constant power level in response to an input RF signal of varying power level, comprising:
   a first multistage amplifier responsive to said input RF signal for generating a first output RF signal;
   a second multistage amplifier responsive to said first output RF signal for generating a second output RF signal;
   each of said first and second amplifiers including one or more field effect type transistors each having gate, drain and source electrodes, said transistors of each amplifier being connected in cascaded arrangement;
   means for biasing said transistors of said first amplifier to produce a predetermined gain level of said first output RF signal;
   means for biasing said transistors of said second amplifier such that said second amplifier is operated in a saturated condition at the gain level of said first output RF signal, such that said second output RF signal is substantially constant with said varying input RF power and the final output power variation is small compared to the input power variation; and
   feedback circuit means between the gate and drain electrodes of each transistor of said second amplifier to provide a predetermined voltage to each transistor to reduce said final output power variation.

3. A power limiter for generating an output RF signal of substantially constant power level in response to an input RF signal of varying power level, comprising:
   a first multistage amplifier responsive to said input RF signal for generating a first output RF signal;
   a second multistage amplifier responsive to said first output RF signal for generating a second output RF signal;
   each of said first and second amplifiers including one or more field effect type transistors each having gate, drain and source electrodes, said transistors of each amplifier being connected in cascaded arrangement;
   means for biasing said transistors of said first amplifier to produce a predetermined gain level of said first output RF signal;
   means for biasing said transistors of said second amplifier such that said second amplifier is operated in a saturated condition at the gain level of said first output RF signal, such that said second output RF signal is substantially constant with said varying input RF power and the final output power variation is small compared to the input power variation; and
   feedback circuit means between the gate electrode of a preceeding transistor and the drain electrode of a succeeding transistor of said second amplifier to provide a predetermined voltage to said preceeding transistor to reduce said final output power variation.

* * * * *